US006611466B2

(12) United States Patent
Lee et al.

(10) Patent No.: US 6,611,466 B2
(45) Date of Patent: Aug. 26, 2003

(54) SEMICONDUCTOR MEMORY DEVICE CAPABLE OF ADJUSTING THE NUMBER OF BANKS AND METHOD FOR ADJUSTING THE NUMBER OF BANKS

(75) Inventors: Hi-Choon Lee, Kyungki-do (KR); Byoung-ju Kim, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 10/135,987

(22) Filed: Apr. 29, 2002

(65) Prior Publication Data

US 2003/0002358 A1 Jan. 2, 2003

(30) Foreign Application Priority Data

Jul. 2, 2001 (KR) ............................ 01-39330

(51) Int. Cl.$^7$ ................................. G11C 7/00
(52) U.S. Cl. ................. 365/200; 365/230.03
(58) Field of Search ............... 365/200, 230.03

(56) References Cited

U.S. PATENT DOCUMENTS 5,737,766 A * 4/1998 Tan ........................... 711/178

* cited by examiner

*Primary Examiner*—M. Tran
(74) *Attorney, Agent, or Firm*—Marger Johnson & McCollom, P.C.

(57) ABSTRACT

A semiconductor memory device, which is capable of adjusting the number of banks from 2N to N and thus increasing product production and repair efficiency, and a method thereof are provided. The semiconductor memory device includes a switching circuit, a control circuit, and a redundant circuit. The switching circuit selectively transmits a first address or a second address in response to a control signal. The control circuit selectively activates $2^N$ banks in response to N−1 (where N is a natural number) bank selection addresses and the first address or selectively activates $2^{N-1}$ banks in response to the N−1 bank selection addresses. The redundant circuit controls repair of the defective normal memory cells. Each of the $2^N$ banks comprises one memory block. Each of the $2^{N-1}$ banks comprises 2 memory blocks, each of which is selectively activated in response to the second address. It is preferable that the defective normal memory cells are repaired in an activated bank in response to an output signal of the redundant circuit.

11 Claims, 5 Drawing Sheets

SEMICONDUCTOR MEMORY DEVICE CAPABLE OF ADJUSTING THE NUMBER OF BANKS AND METHOD FOR ADJUSTING THE NUMBER OF BANKS

CROSS REFERENCE TO RELATED APPLICATIONS

This application claims priority from Korean Priority Document No. 2001-39330, filed on Jul. 2, 2001 with the Korean Industrial Property Office, which document is hereby incorporated by reference.

BACKGROUND OF THE INVENTION

1. Field of the Invention

The present invention relates to a semiconductor memory device, and more particularly, to a semiconductor memory device which is capable of adjusting the number of banks and a method for adjusting the number of banks.

2. Description of the Related Art

In most cases, the time taken to access data in dynamic access random memories (DRAMs) can be reduced by increasing the number of banks including memory blocks and thus decreasing losses in row active time. However, the increase in the number of banks decreases the efficiency of repairing defective rows in each of the banks.

FIG. 1 is a diagram illustrating a conventional semiconductor memory device using a memory block as one bank. Referring to FIG. 1, a semiconductor memory device 10 includes 2N (where N is a natural number) banks 1 through 4, and the banks 1 through 4 include normal memory cell blocks 3, 9, 15, and 21, respectively, and redundant memory cell blocks 5, 11, 17, and 23, respectively.

A method for replacing a defective cell in the normal memory cell block 3 with a normal cell in the redundant memory cell block 5 will be described with reference to FIG. 1.

The redundant cell block 5 may be set to substitute for a plurality of defective cells. However, the redundant cell block 5 is supposed to substitute for only one defective cell in the following.

If the bank 1 is activated, the other banks 3 and 4 are activated except the bank 2. In this case, sense amplifiers 1 and 7 operate normally. However, since the bank 2 is inactive, in other words, since the bank 2 is precharged, the bank 2 cannot use the sense amplifier 7.

Accordingly, if two or more defective rows are generated in the bank 1, it is impossible to replace the defective rows with redundant rows in the conventional memory device having such a structure shown in FIG. 1.

FIG. 2 is a diagram illustrating a conventional semiconductor memory device using two memory blocks as one bank. Referring to FIG. 2, a semiconductor memory device 20 includes N (where N is a natural number) banks 11 and 21, and the bank 11 includes two normal memory cell blocks 33 and 39 and two redundant memory cell blocks 35 and 41.

A method for repairing two defective rows in the normal memory cell block will be described with reference to FIG. 2. If the bank 11 is activated, sense amplifiers 31, 37, and 43 operate normally. Thus, if two defective rows are generated in the bank 11, the two defective rows are repaired by using the redundant cell block 35 and the redundant cell block 41.

FIG. 3 is a diagram illustrating the translation of bank selection addresses into row addresses in the case of transforming a semiconductor memory device including 32 banks into a semiconductor memory device including 16 banks. Specifically, FIG. 3 shows the differences in bank selection addresses and row addresses between a semiconductor memory device including 32 banks and a semiconductor memory device including 16 banks, with an arrow to indicate the transformation.

A semiconductor memory device including $2^N$ banks needs N bank selection addresses for selecting each of the $2^N$ banks. Accordingly, in the case of a semiconductor memory device including 32 banks, each bank selection address BADR<i> (where i is a natural number between 0 and 4) for selecting the 32 banks is comprised of 5 bits. On the other hand, in the case of a semiconductor memory device including 16 banks, each bank selection address BADR<i> (where i is a natural number between 0 and 3) for selecting the 16 banks is comprised of 4-bit addresses.

For the case of either 16 or 32 banks, there is a row address made from n+1 bits. These bits are labeled row addresses RADR<i> (where i is a natural number between 0 and n).

In addition, there is a bank address. For the general case of 32 banks, the bank address has five bits BADR<0>, BADR<1>, BADR<2>, BADR<3>, BADR<4>. For the general case of 16 banks, however, the bank address has only four bits BADR<0>, BADR<1>, BADR<2>, BADR<3>. There will be no need for bit BADR<4>.

In the particular case, however, where there is a conversion from 32 banks to 16 banks, there will be one less bank bit, but one more row address bit. More particularly, bit BADR<4>, which is the most significant bit, is used as a translation row address RADR<n+1> bit. Nevertheless, the total number of bits remains the same.

Referring back to FIG. 2, the bank 11 is selected by the bank selection address BADR<i> (where i is a natural number between 0 and 3), and the normal memory cell block 33 or 39 is selected by the translation row address RADR<n+1>. In other words, the translation row address RADR<n+1> is used to select one out of two normal memory cell blocks constituting one bank.

A limitation of the prior art is that banks cannot be integrated easily, to exploit the redundancy. That is because semiconductor memory devices including 32 banks and semiconductor memory devices including 16 banks must be integrated in different chips. Such chips, which are designed as different integrated circuits, must be separately tested using different repairing methods. Accordingly, different manufacturing processes and testing processes are required for individual products, which makes it hard to reconfigure the blocks of a device from 32 banks to 16 banks. This lowers the productivity in a manufacturing process.

SUMMARY OF THE INVENTION

To solve the above-described problems, it is an object of the present invention to provide a semiconductor memory device which is capable of adjusting the number of banks using blocks designed on the same chip and a method for adjusting the number of banks using blocks designed on the same chip.

Accordingly, to achieve the above object, there is provided a semiconductor memory device including memory blocks having a plurality of normal memory cells and a plurality of redundant memory cells for repairing a defective normal memory cell according to a first embodiment of the present invention. The semiconductor memory device includes a switching circuit, a control circuit, and a redundancy circuit.

The switching circuit selectively transmits a first address or a second address in response to a control signal. The control circuit selectively activates $2^N$ banks in response to N−1 bank selection addresses and the first address or selectively activates $2^{N-1}$ banks in response to the N−1 bank selection addresses (N is a natural number).

The redundant circuit controls the repair of the defective normal memory cells. Here, each of the $2^N$ banks comprises one memory block, each of the $2^{N-1}$ banks comprises 2 memory blocks, each of which is selectively activated in response to the second address, and the defective normal memory cells are repaired in an activated bank in response to an output signal of the redundant circuit.

To achieve the above object, there is provided a semiconductor memory device including memory blocks having a plurality of normal memory cells and a plurality of redundant memory cells for repairing defective normal memory cells according to a second embodiment of the present invention. The semiconductor memory device includes a switching circuit, a control circuit, and a redundant circuit.

The switching circuit selectively transmits a first address or a second address in response to a control signal. The control circuit selectively activates $2^N$ banks in response to N−2 bank selection addresses and the first address or selectively activates $2^{N-2}$ banks in response to the N−1 bank selection addresses (N is a natural number).

The redundant circuit controls repair of the defective normal memory cells. Here, each of the $2^N$ banks comprises one memory block, each of the $2^{N-2}$ banks comprises 4 memory blocks, each of which is selectively activated in response to the second address, and the defective normal memory cells are repaired in an activated bank in response to an output signal of the redundant circuit.

Preferably, the first address and the second address are separately input via different input circuits and the first address is the same as the second address.

The redundant circuit includes a first fuse block, a second fuse block, and a logic circuit.

The first fuse block includes a plurality of fuses which are selectively cut in response to the second address in accordance with the memory cell block including the defective normal memory cell. The second fuse block includes a plurality of fuses which are selectively cut in response to addresses for selecting the defective normal memory cell in accordance with the rows of the defective normal memory cell.

The logic circuit performs a logic operation on the output signals of the first and second fuse blocks. Preferably, the output signal of the first fuse block is activated, the defective normal memory cell can be repaired by a memory block not-selected by the second address in the same bank as the memory block selected by the second address.

To achieve the above object, there is provided a method for adjusting the number of banks of a semiconductor memory device from $2^N$ (where N is a natural number) into $2^{N-1}$ in response to a control signal according to a first embodiment of the present invention, the method including generating the control signal for transmitting a first address or a second address, selectively activating the $2^N$ banks in response to N−1 bank selection addresses and the first address or selectively activating the $2^{N-1}$ banks in response to the N−1 bank selection addresses, and repairing defective normal memory cells in response to the second address.

Here, each of the $2^N$ banks comprises K (where K is a natural number) memory cell blocks each including a plurality of normal memory cells and redundant memory cells used to repair the defective normal memory cells, each of the $2^{N-1}$ banks comprises 2K memory blocks, each of which is selectively activated in response to the second address, and the defective normal memory cells are repaired in an activated bank.

To achieve the above object, there is provided a method for adjusting the number of banks of a semiconductor memory device from $2^N$ (where N is a natural number) into $2^{N-2}$ in response to a control signal according to a second embodiment of the present invention, the method including generating the control signal for transmitting a first address or a second address, selectively activating the $2^N$ banks in response to N−2 bank selection addresses and the first address or selectively activating the $2^{N-2}$ banks in response to the N−2 bank selection addresses, and repairing defective normal memory cells in response to the second address. Here, each of the $2^N$ banks comprises K (where K is a natural number) memory cell blocks each including a plurality of normal memory cells and redundant memory cells used to repair the defective normal memory cells, each of the $2^{N-2}$ banks comprises 4K memory blocks, each of which is selectively activated in response to the second address, and the defective normal memory cells are repaired in an activated bank.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
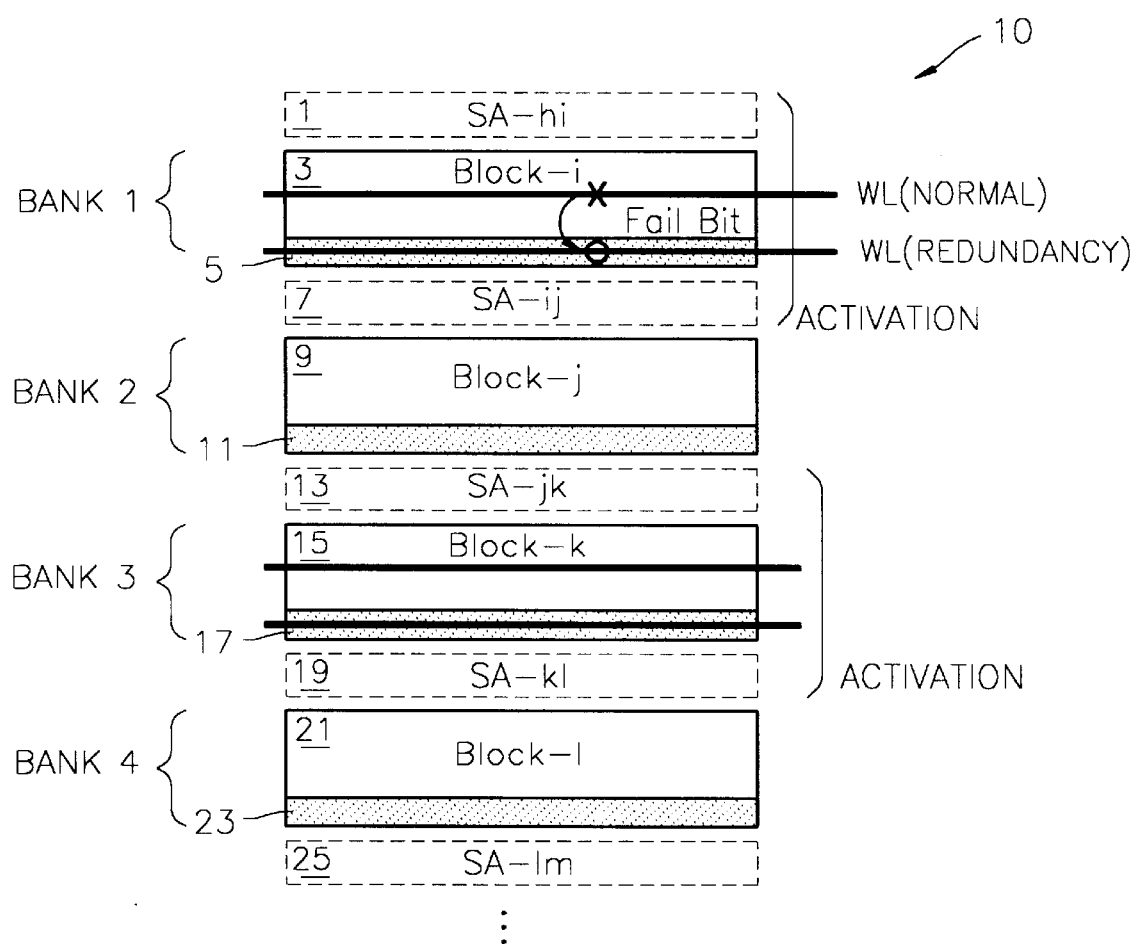
FIG. 1 is a diagram illustrating row redundant flexibility in conventional N banks.
Figure 2:
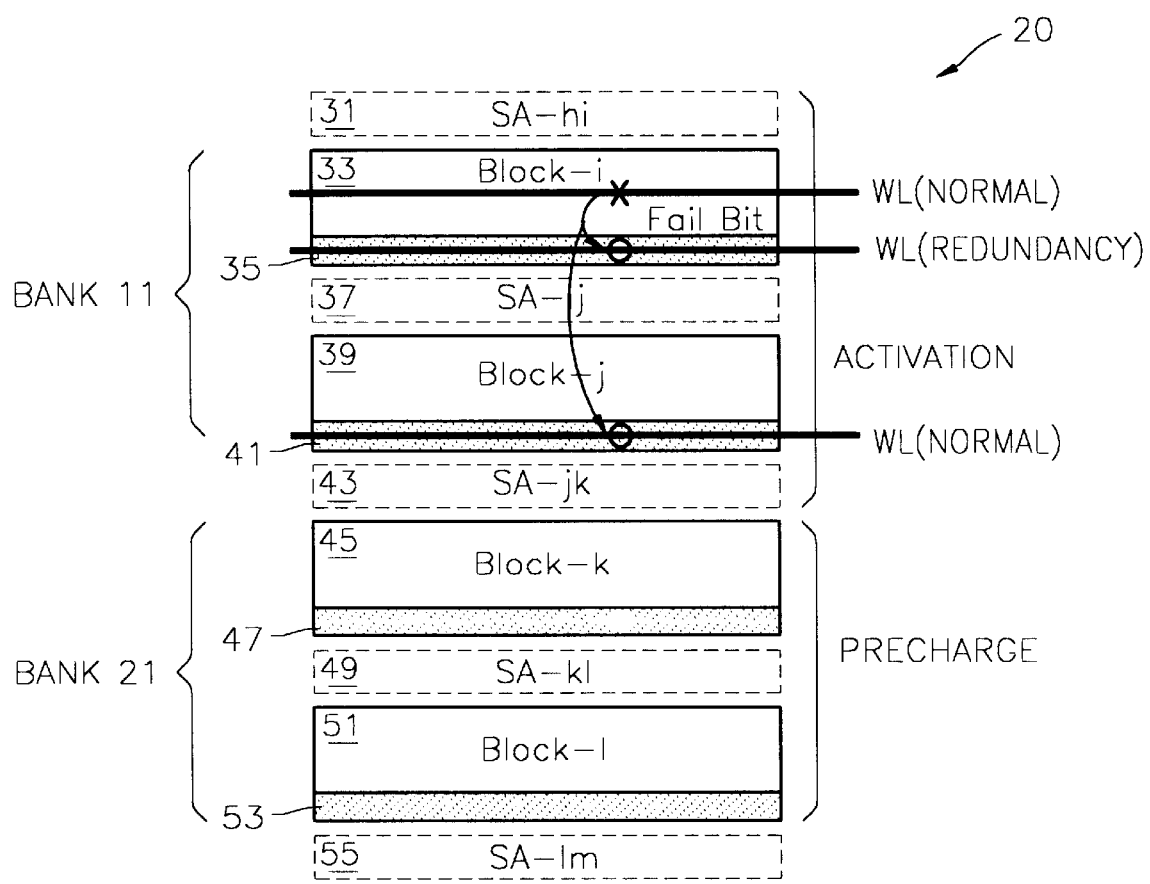
FIG. 2 is a diagram illustrating row redundant flexibility in conventional N/2 banks.
Figure 3:
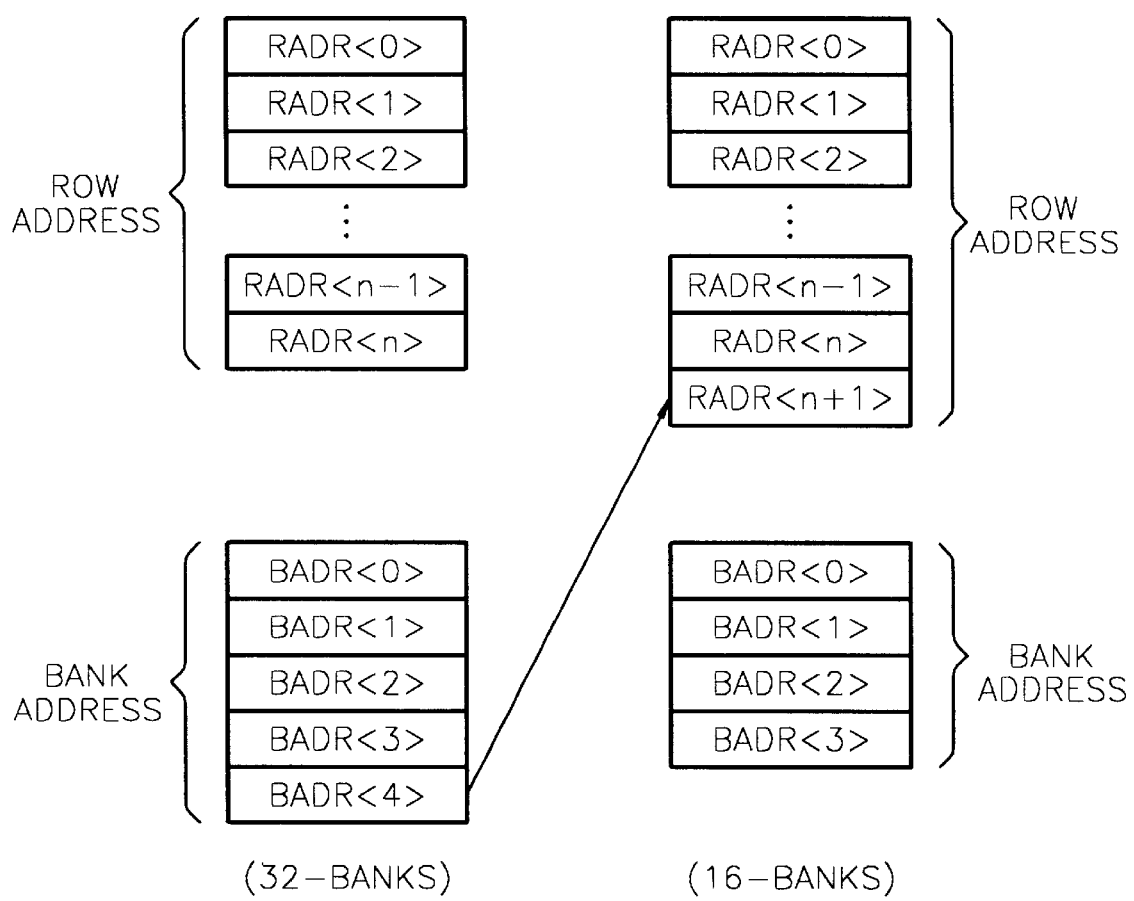
FIG. 3 is a diagram illustrating the translation of row addresses into bank selection addresses in the case of transforming conventional 32 banks into 16 banks.

The present invention will now be described more fully with reference to the accompanying drawings, in which a preferred embodiment of the invention is shown. The same reference numerals in different drawings represent the same elements.

Figure 4:
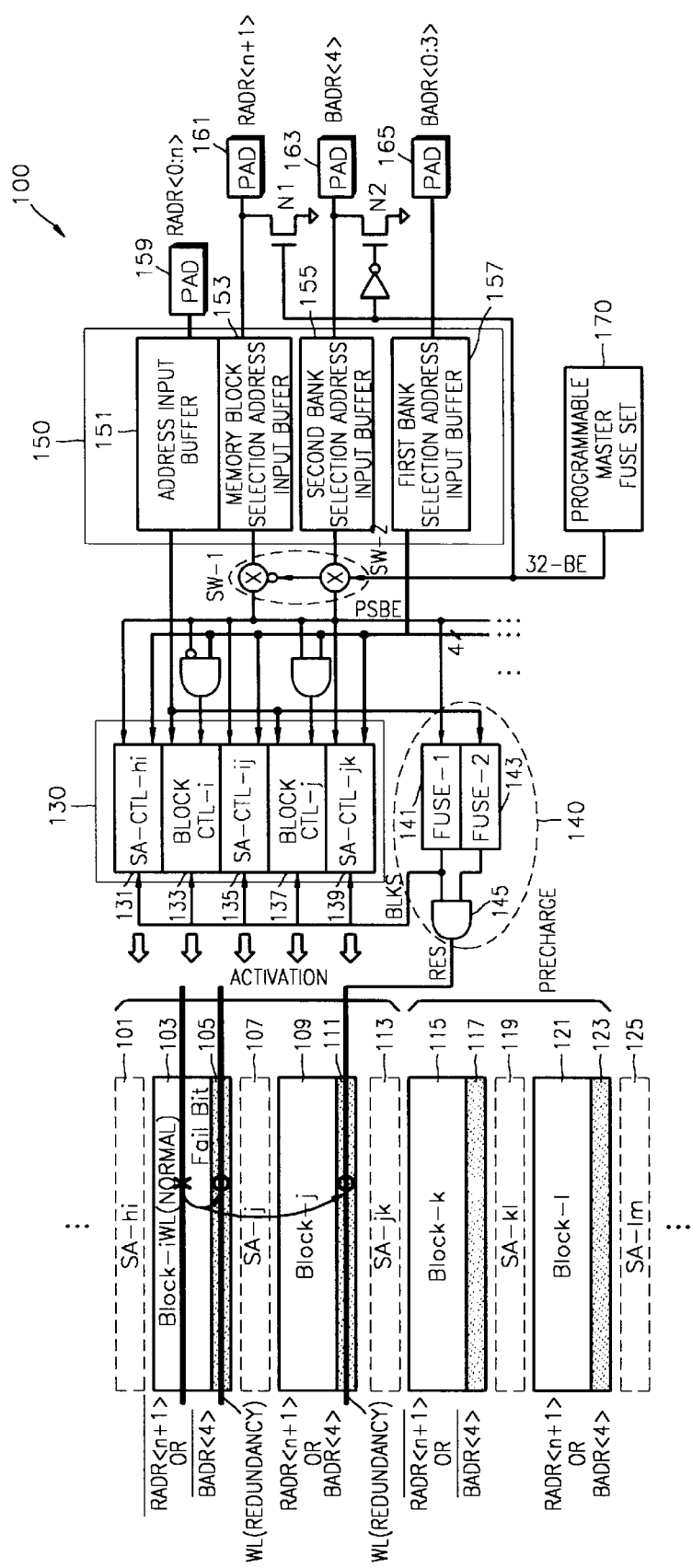
FIG. 4 is a diagram illustrating a semiconductor memory device which is capable of transforming 2N banks into N banks according to an embodiment of the present invention.

FIG. 4 is a diagram illustrating a semiconductor memory device which is capable of transforming 2N (where N is a natural number) banks into N banks. According to an aspect of the present invention, it is quite clear that 2N banks can be transformed into N/2 banks or N/4 banks. However, FIG. 4 shows only the case of transforming 32 banks into 16 banks for the convenience of illustration.

Referring to FIG. 4, a semiconductor memory device includes a plurality of adjustable banks, an input buffer unit 150, a controller 130, a redundant address fuse set 140, and a programmable master fuse set 170.

The semiconductor memory device 100 includes a plurality of memory blocks. Each of the memory blocks includes a normal memory block 103, 109, 115, or 121 which includes a plurality of normal memory cells, and a redundant cell block 105, 111, 117, or 123 which includes redundant memory cells used to repair defective normal memory cells.

According to the present invention, 32 memory blocks are included in a semiconductor device. These are configured either as 32 banks of one memory block each, or as 16 banks of 2 memory blocks each, or as 8 banks, of 4 memory blocks each.

The input buffer unit 150 includes an address input buffer 151, a memory block selection address input buffer 153, a first bank selection address input buffer 157, and a second bank selection address input buffer 155.

In addition, four pads are shown 159, 161, 163, 165. Pad 159 receives row address signals RADR<0:n>, and pad 161 receives row address signal RADR<n+1>. Moreover, pad 165 receives bank address signals BADR<0:3>, and pad 163 receives bank address signal BADR<4>.

The address input buffer 151 buffers (n+1) row addresses RADR<0:n> input via a pad 159. These are used to select word lines (or rows) of memory cells of each of the adjustable banks. Input buffer 151 then outputs the results to the controller 130 and to the redundant address fuse set 140.

The memory block selection address input buffer 153 buffers a memory block selection address RADR<n+1> input via a pad 161, and outputs the result to a first switch SW-1. Here, the memory block selection address RADR<n+1> is the most significant bit (MSB) or the least significant bit (LSB) among bank selection addresses, and is the same as a bank selection address BADR<4> input via a pad 163 to the second bank selection address input buffer 155.

The memory block selection address RADR<n+1> is introduced for selecting one of the normal memory cell blocks 103 and 109. In a semiconductor memory device including 8 banks, each of which includes 4 memory blocks, the memory block selection address RADR<n+1> is comprised of 2 bits.

The first switch SW-1 outputs the output signal of the memory block selection address input buffer 153 to a first node PSBE in response to an output signal 32-BE of the programmable master fuse set 170.

The first bank selection address input buffer 157 buffers a 4-bit bank selection address BADR<0:3> input to a pad 165, and outputs the result to the controller 130. The second bank selection address input buffer 155 buffers the most significant bit (MSB), which is the bank selection address BADR<4> input via the pad 163, and outputs the result to a second switch SW-2.

The second switch SW-2 outputs the output signal of the second bank selection address input buffer 155 to the first node PSBE, in response to the output signal 32-BE of the programmable master fuse set 170.

The controller 130 includes sense amplifier controllers 131, 135, and 139 for controlling a plurality of sense amplifiers 101, 107, and 113, respectively. The controller 130 also includes block controllers 133 and 137 for controlling the normal memory cell blocks 103 and 109, respectively.

The controller 130 controls the operations of the sense amplifiers 101, 107, and 113 and the normal memory cell blocks 103 and 109 in response to a block switching signal. The block switching signal is an output signal of a first fuse block 141, the output signals of the input buffer unit 150, and the programmable master fuse set 170.

The redundant address fuse set 140 includes a first fuse block 141 and a second fuse block 143. The first fuse block 141 outputs a block switching signal BLKS for controlling the controller 130, in response to the output signal of the first node PSBE. The second fuse block 143 decodes the addresses of the redundant memory cells, in response to the output signal of the address input buffer 151.

The programmable master fuse set 170 outputs the block control master clock 32-BE. This way it converts 2N banks into N banks or N/2 banks. For example, it may convert 32 banks into 16 banks or 8 banks.

Figure 5:
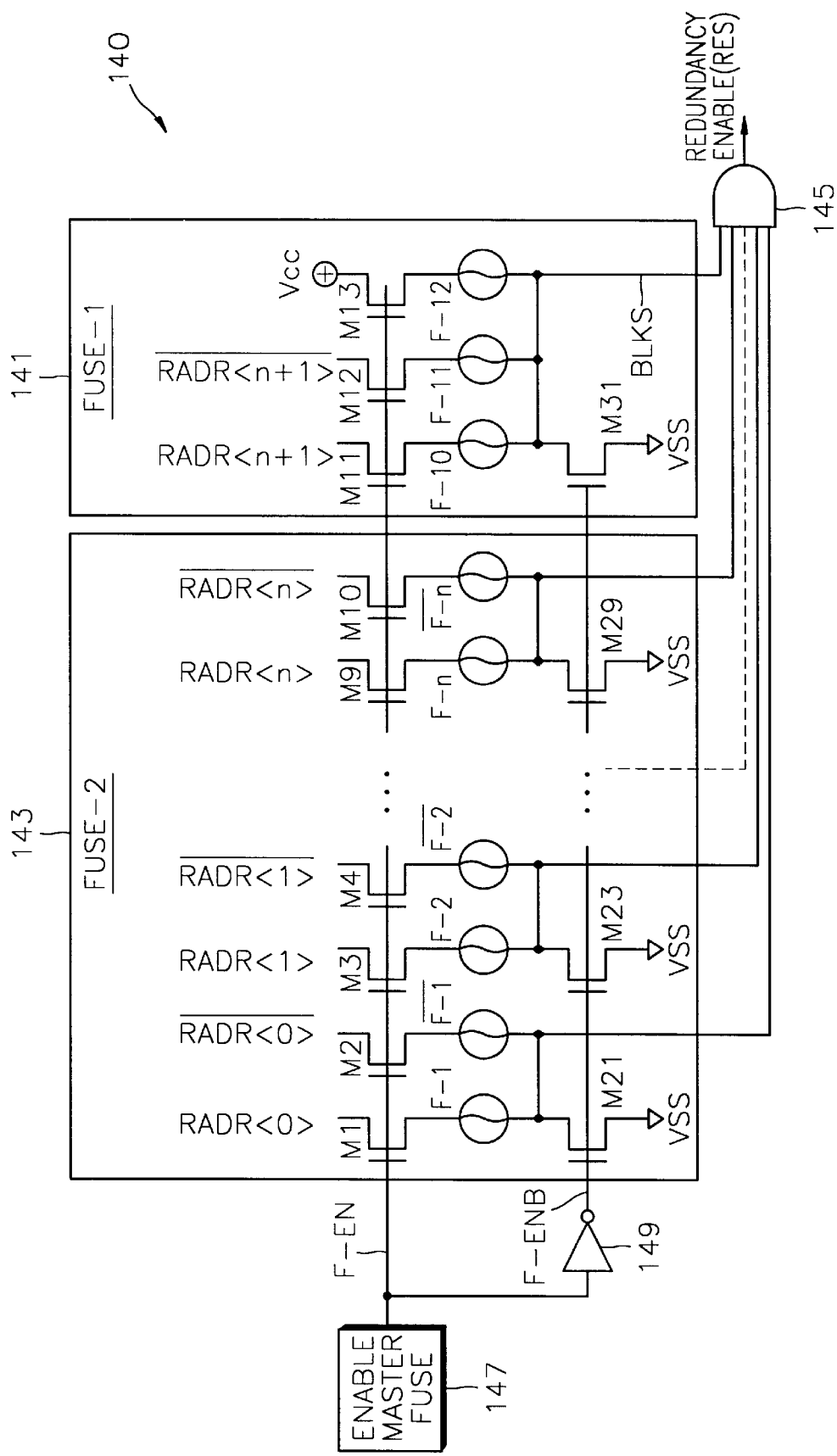
FIG. 5 is a logic diagram illustrating the redundant address fuse set of FIG. 4.

FIG. 5 is an electrical diagram of the redundant address fuse set 140 of FIG. 4. Referring to FIG. 5, the redundant address fuse set 140 includes an enable master fuse 147, the first fuse block 141, the second fuse block 143, and a logic gate 145.

The first fuse block 141 includes fuses F-10 and F-11 for programming the memory block selection address RADR<n+1>. The first fuse block 141 also includes a fuse F-12 for applying power voltage Vcc.

The second fuse block 143 includes a plurality of fuses F-1 through F-n and/(F-1) through/(F-n) for programming redundant addresses RADR<0> through RADR<n>.

The enable master fuse 147 outputs an enable signal F-EN for gating transistors M1 through M13. An inversion circuit 149 inverts the enable signal F-EN and outputs an inverted enable signal F-ENB for gating transistors M21 through M31. Enable signal F-EN has a value depending on which blocks are selected. The value is a logic "high" when the redundant cell blocks 105, 111, 117, and 123 are selected, and a logic "low" when the normal memory cell blocks 103, 109, 115, and 121 are selected.

The logic gate 145 performs an AND operation on the output signals of the first and second fuse blocks 141 and 143, and outputs a redundant enable signal RES. Redundant enable signal RES is for enabling each of the redundant cell blocks 105, 111, 117, and 123.

Hereinafter, a method for adjusting the number of banks from 32 to 16 in the case of using a semiconductor memory device including 32 banks according to an embodiment of the present invention will be described with reference to FIGS. 4 and 5.

A method for setting the semiconductor memory device 100 to have 32 banks will be described first. Each of the 32 banks is supposed to include one memory block, in other words, one normal memory cell block 103, 109, 115, or 121 and a corresponding one redundant cell block 105, 111, 117, or 123, respectively. In addition, the programmable master fuse set 170 is supposed to activate the bank control master clock 32-BE. In this embodiment, this is implemented by making the bank control master clock 32-BE logic 'high'.

The first switch SW-1 is turned off in response to the bank control master clock 32-BE, which has been activated, thus blocking the output signal of the input buffer 153. A transistor N1 is turned on, and sets the bias level of the voltage of the pad 161 to a ground voltage level VSS.

The second switch SW-2 is turned on in response to the bank control master clock 32-BE. This way second switch SW-2 transmits the most significant bit MSB, that is, the bank selection address BADR<4>, of the bank selection addresses to the first node PSBE. As a result, one of the 32 banks can be selected by a combination of the bank selection addresses BADR<0:3> and the most significant bit MSB, that is, the bank selection address BADR<4>.

The redundant address fuse set 140 responds to the output signal of the address input buffer 151 and the output signal of the first node PSBE. In a case where the semiconductor memory device 100 operates normally, the first switch SW-1 is off. Thus, the first fuse block 141 does not program the memory block selection address RADR<n+1>, and the enable master fuse 147 outputs the enable signal F-EN as inactive.

As a result, the transistor M31 of the first block 141 is turned on, and the block switching signal BLKS becomes logic 'low'. Thus, the controller 130 activates the normal memory cell block 103.

However, if a defect occurs at a normal cell of the memory cell block 103, the fuses F-10 and F-11 of the first fuse block 141 are cut, and the selection of the first fuse 141 is set to a 'don't care' condition, so that the defective normal memory cell can be replaced by a redundant memory cell.

In the second fuse block 143, some of the fuses F-1 through F-n are selectively blown for selecting the address of the defective normal memory cell in response to the row addresses RADR<0:n> input to the second fuse block 143.

In other words, the enable signal F-EN is activated, and the transistors M1 through M10 are turned on. Then, the appropriate ones of fuses F-1 through F-n are cut, except for those connected to a row address to be repaired. Accordingly, the second fuse block 143 is programmed as the row address to be repaired.

If the block switching signal BLKS is inactivated, the controller 130 selects one of the 32 banks in response to the combination of the 4-bit bank selection addresses BADR<0:3> (which is the output signal of the input buffer 157), and of the most significant bit MSB, that is, the bank selection address BADR<4> (which is the output signal of the first node PSBE). The controller 130 thus simultaneously selects a wordline WL of a memory cell of the selected bank.

In FIG. 4, signals BADR<4> and /BADR<4> represent the most significant bit (MSB) of the bank selection addresses for selecting the 32 banks. In other words, if the normal memory cell block 103 of one of the 32 banks is activated by the output signal of the controller 130, the sense amplifiers 101 and 107 activate the normal memory cell block 103 to sense the data of the normal memory cell block 103.

However, the normal memory cell block 109 is inactivated, and thus if there is a defective row in the normal memory cell block 103, the defective row of the normal memory cell block 103 is replaced by only the redundant memory cell block 105.

Hereinafter, a method is described for setting the semiconductor memory device 100 to have 16 banks. Each of the 16 banks includes two normal memory cell blocks 103 and 109, and two redundant cell blocks 105 and 111. The programmable master fuse set 170 inactivates the bank control master clock 32-BE, in other words, make the bank control master clock 32-BE logic 'low'.

Since the first switch SW-1 is turned on in response to the bank control master clock 32-BE being inactive, the memory block selection address RADR<n+1> is translated to the first node PSBE. That address contains the most significant bit MSB, that is, the bank selection address BADR<4>, for selecting 32 banks input via the pad 161.

The memory block selection address RADR<n+1> selects one of the normal memory cell blocks 103 and 109 of a particular bank, which has been selected by the bank selection addresses BADR<0:3>.

The second switch SW-2 is turned off, in response to the bank control master clock 32-BE being inactive. In addition, the transistor N2 is turned on, and sets the bias level of the voltage of the pad 163 to a ground voltage level VSS. This blocks the path of the input buffer 155.

The controller 130 selects one of the 16 banks in response to the 4-bit bank selection addresses BADR<0:3>. In this case, the memory block selection address RADR<n+1> selects one of the normal memory cell blocks 103 and 109 in the selected bank, and simultaneously selects a wordline of a memory cell in the selected bank in response to the output signal of the address input buffer 151.

If the normal memory cell block 103 constituting each of the 16 banks is activated, the sense amplifiers 101 and 107 are activated. On the other hand, if the normal memory cell block 109 is activated, the sense amplifiers 107 and 113 are activated.

Hereinafter, a method for repairing two defective rows in the normal memory cell block 103 with a redundant cell block will be described.

In a case where the memory block selection address RADR<n+1> is input into the first fuse block 141, the fuses F-11 and F12 are cut so as to select a memory block Block-j among memory blocks Block-i and Block-j. The second fuse block 143 programs the row addresses RADR<0:n> for selecting redundant memory cells of the memory block Block-j.

According to the programming of the first fuse block 141, the block switching signal BLKS is activated. Then, the fuses of the first and second fuse blocks 141 and 143 are programmed, thus activating the redundant enable signal RES.

In addition, the fuse F-12 of the first fuse block 141 and one of the fuses F-10 and F-11 are selectively cut to program the addresses of defective memory cells, and a plurality of fuses F-1 through F-n constituting the second fuse block 143 are selectively decoded, to program the addresses of the defective memory cells.

Accordingly, in a case where the row addresses RADR<0:n> input via the address input buffer 151 are the same as defective row addresses, the block switching signal BLKS from first fuse block 141, disables a control circuit 133 for controlling the normal memory cell block 103, a control circuit 131 for controlling the sense amplifier 101, and a control circuit 135 for controlling the sense amplifier 107. Block switching signal BLKS then enables a control circuit 137 for controlling the normal memory cell block 109, the control circuit 135 for controlling the sense amplifier 107, and a control circuit 139 for controlling the sense amplifier 113.

When there are defective rows in the normal memory cell block 103, it is possible to repair the normal memory cell block 103 with the redundant cell block 105 or the redundant cell block 111 adjacent to the redundant cell block 105. This increases the repairing efficiency, and thus also the manufacturing yield.

The semiconductor memory device of the present invention includes the programmable master fuse set 170 and a redundant programmable address decoder, i.e., the first fuse block 141 or the second fuse block 143. Thus, the semiconductor memory device of the present invention can adjust the number of banks and can simultaneously program repairing of defective cells with the use of the redundant programmable address decoder.

As described above, the semiconductor memory device according to the present invention, which is capable of adjusting the number of banks from 2N to N, N/2, or N/4, and the method thereof can improve productivity and repairing efficiency. As written above, N is a natural number.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device including memory blocks having a plurality of normal memory cells and a plurality of redundant memory cells for repairing a defective one of the normal memory cells, the semiconductor memory device comprising:

a switching circuit for selectively transmitting one of a first address and a second address in response to a control signal;

a control circuit for selectively activating one of $2^N$ banks in response to N-1 bank selection addresses and to the first address, and $2^{N-1}$ banks in response to the N-1 bank selection addresses, N being a natural number; and a redundant circuit for controlling the repair of the defective normal memory cells, wherein each of the $2^N$ banks comprises one memory block, each of the $2^{N-1}$ banks comprises 2 memory blocks, each of which is selectively activated in response to the second address, and the defective normal memory cells are repaired in an activated bank in response to an output signal of the redundant circuit.

2. A semiconductor memory device including memory blocks having a plurality of normal memory cells and a plurality of redundant memory cells for repairing defective ones of the normal memory cells, the semiconductor memory device comprising:

a switching circuit for selectively transmitting one of a first address and a second address in response to a control signal;

a control circuit for selectively activating one of $2^N$ banks in response to N-2 bank selection addresses and to the first address, and $2^{N-2}$ banks in response to the N-1 bank selection addresses, N being a natural number; and a redundant circuit for controlling a repair of the defective normal memory cells, wherein each of the $2^N$ banks comprises one memory block, each of the $2^{N-2}$ banks comprises 4 memory blocks, each of which is selectively activated in response to the second address, and the defective normal memory cells are repaired in an activated bank in response to an output signal of the redundant circuit.

3. The semiconductor memory device of claim 1 or 2, wherein the first address and the second address are input separately via different input circuits.

4. The semiconductor memory device of claim 1, wherein the first address is one of a most significant bit and a least significant bit.

5. The semiconductor memory device of claim 1 or 2, wherein the first address is the same as the second address.

6. The semiconductor memory device of claim 1 or 2, wherein the redundant circuit comprises:

a first fuse block comprising a plurality of fuses which are selectively cut in response to the second address in accordance with the memory cell block including the defective normal memory cell;

a second fuse block comprising a plurality of fuses which are selectively cut in response to addresses for selecting the defective normal memory cell in accordance with the rows of the defective normal memory cell; and a logic circuit for performing a logic operation on the output signals of the first and second fuse blocks.

7. The semiconductor memory device of claim 5, wherein if the output signal of the first fuse block is activated, the defective normal memory cell is repaired by a memory block not-selected by the second address in the same bank as the memory block selected by the second address.

8. A semiconductor memory device comprising:

K banks, each of which comprises N memory cell blocks including a plurality of normal memory cells and redundant memory cells used to repair defective ones of the normal memory cells;

a control signal generation circuit which generates a control signal for controlling the transformation of K banks into K/2 banks, each comprising 2N memory cell blocks; and a decoding circuit which decodes a block selection address for selecting each of the 2N memory cell blocks input in response to addresses input to select the redundant memory cells and the control signal, wherein the defective normal memory cells are repaired in an activated bank.

9. A method for adjusting the number of banks of a semiconductor memory device from $2^N$ (where N is a natural number) into $2^{N-1}$ in response to a control signal, the method comprising:

generating the control signal for transmitting one of a first address and a second address;

selectively activating one of the $2^N$ banks in response to N-1 bank selection addresses and to the first address, and the $2^{N-1}$ banks in response to the N-1 bank selection addresses; and repairing defective normal memory cells in response to the second address, wherein each of the $2^N$ banks comprises K (where K is a natural number) memory cell blocks each including a plurality of normal memory cells and redundant memory cells used to repair the defective normal memory cells, each of the $2^{N-1}$ banks comprises 2K memory blocks, each of which is selectively activated in response to the second address, and the defective normal memory cells are repaired in an activated bank.

10. A method for adjusting the number of banks of a semiconductor memory device from $2^N$ (where N is a natural number) into $2^{N-2}$ in response to a control signal, the method comprising:

generating the control signal for transmitting one of a first address and a second address;

selectively activating the $2^N$ banks in response to N-2 bank selection addresses and to the first address or selectively activating the $2^{N-2}$ banks in response to the N–2 bank selection addresses; and repairing defective normal memory cells in response to the second address, wherein each of the $2^N$ banks comprises K (where K is a natural number) memory cell blocks each including a plurality of normal memory cells and redundant memory cells used to repair the defective normal memory cells, each of the $2^{N-2}$ banks comprises 4K memory blocks, each of which is selectively activated in response to the second address, and the defective normal memory cells are repaired in an activated bank.

11. The method of claim 10, wherein the first address is one of a most significant bit and a least significant bit.

* * * * *